United States Patent [19]
Hong

[11] Patent Number: 5,308,777
[45] Date of Patent: May 3, 1994

[54] MASK ROM PROCESS
[75] Inventor: Gary Hong, Hsinchu, Taiwan
[73] Assignee: United Microelectronics Corporation, Hsinchu, Taiwan
[21] Appl. No.: 98,044
[22] Filed: Jul. 28, 1993
[51] Int. Cl.⁵ .......................................... H01L 21/265
[52] U.S. Cl. ......................................... 437/41; 437/44; 437/191
[58] Field of Search ....................... 437/40, 41, 44, 48, 437/52, 191, 195

[56] References Cited

U.S. PATENT DOCUMENTS

| | | | |
|---|---|---|---|
| 5,015,598 | 5/1991 | Verhaar | 437/191 |
| 5,071,780 | 12/1991 | Tsai | 437/44 |
| 5,084,416 | 1/1992 | Ozaki et al. | 437/195 |
| 5,229,326 | 7/1993 | Dennison et al. | 437/44 |
| 5,272,099 | 12/1993 | Chou et al. | 437/191 |

*Primary Examiner*—Tom Thomas
*Assistant Examiner*—Chandra Chaudhari
*Attorney, Agent, or Firm*—George O. Saile; Graham S. Jones

[57] ABSTRACT

A semiconductor device and a method of manufacturing a semiconductor device includes the steps of forming a first conductivity type layer on one surface of a work piece comprising a semiconductor substrate. A gate oxide is formed on the surface of the substrate. A first conductive structure is formed on the gate oxide consisting essentially of polysilicon. An insulating structure is formed in contact with the first conductive structure. Material is removed from the surface of the first conductive structure to expose at least a portion of the surface of the first layer, and to form on the remaining structure on the workpiece a second conductive structure consisting essentially of polysilicon. The polysilicon is in electrical contact with the first conductive structure. Thus, a compound conductive structure is provided on the work piece.

12 Claims, 9 Drawing Sheets

FIG. 11D

MASK ROM PROCESS

BACKGROUND OF THE INVENTION

1. Field of the Invention

This invention relates to semiconductor devices and more particularly to an improved conductor structure.

2. Description of Related Art

A buried bit line ROM cell is by far the most competitive ROM structure of high density ROM memories because it is contactless and hence the cell size is smaller. The dimension of a cell is determined mainly by the pitches of the word line polysilicon structures employed to connect to the cells and the buried N+ bit lines. When the cell dimension shrinks, the buried bit line N+ doping needs to be reduced to avoid the problem of short channel punch through.

A device made with the low N+ concentration produced by the reduced level of doping is sensitive to the counter doping from P− type (boron) doping for programming in the channel region.

The boron implantation with a dose $>1 \times 10^{14}/cm^2$ in the channel area for programming also goes into the source/drain buried N+ area with an As+ implantation dose of about $1 \times 10^{15}/cm^2$, which increases source/drain capacitance. Low buried bit line resistance is important because every cell will have a different bit line resistance to metal pick up contact (low resistance metallic line in contact with the contact opening.) For example, there will be one contact for every 32 cells.

Figure 1:
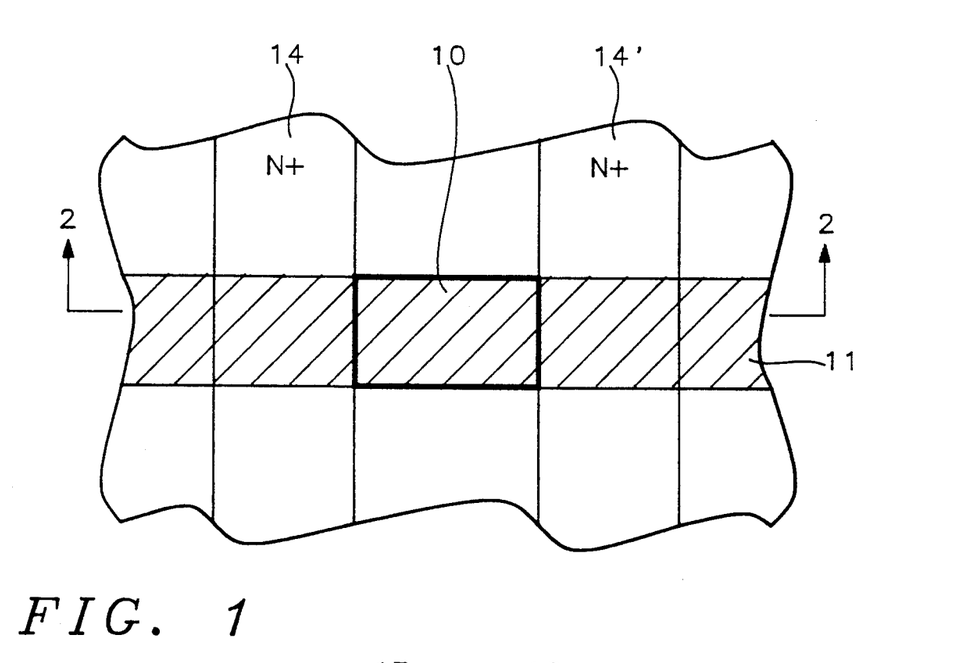
FIG. 1 is a plan of a semiconductor device illustrating a certain design rule, with a minimal opening for ROM code implantation in a semiconductor substrate.
Figure 2:
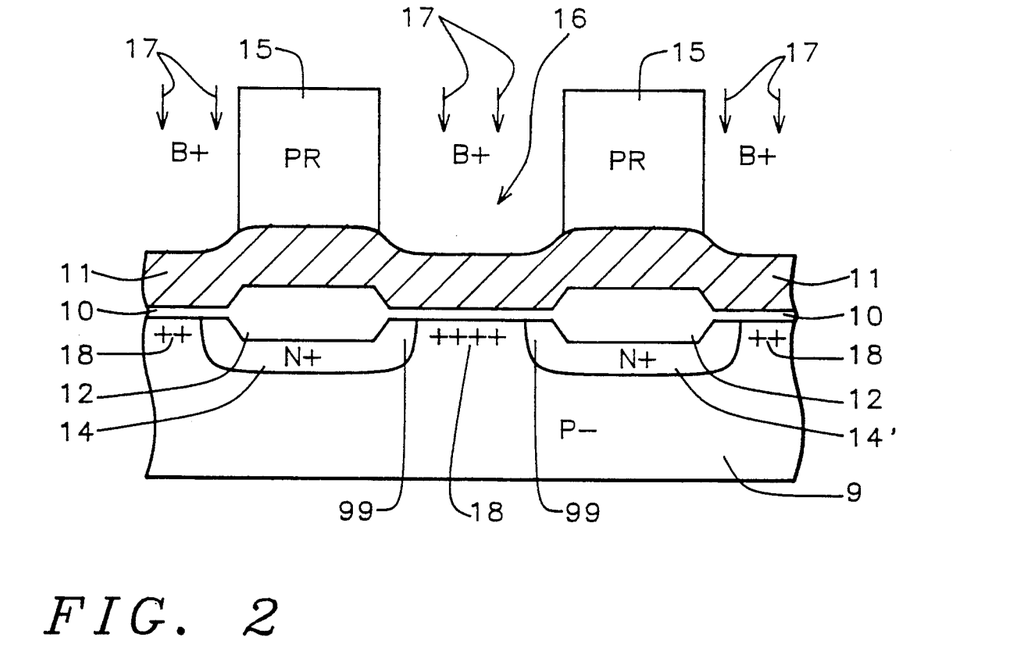
FIG. 2 shows a section taken along line 2—2 in FIG. 1.

FIG. 1 shows a plan view of a semiconductor device and FIG. 2 shows a sectional view of that device taken along line 2—2 in FIG. 1. For a certain design rule, the minimal opening for ROM code implantation is the same as channel area 10 in a semiconductor substrate 9 shown in FIGS. 1 and 2 where 10 is the channel area and the word line 11 is formed of polysilicon or polycide, in accordance with the state of the art and buried bitlines 14 and 14' are at right angles to word line 11.

The cross section along the direction of word line 11 taken along line 2—2 in FIG. 1 is shown in FIG. 2. The word line 11 crosses over the SDOX (Source/Drain Oxide) layer 12. The SDOX layer 12 is grown over an N+ implant area during gate oxide oxidation. SDOX layer 12 is thicker (between about 600 Å about 1500 Å) than the gate oxide (about 200 Å) and the channel area 10 composed of a gate oxide over P- well (P- sub) area. The bit lines 14, 14' (source/drain) doped with N+ ions lie beneath the SDOX layer 12. The source and the drain regions can be interchangeable. The source and the drain are bit lines also.

Photoresist layer 15 has been added to the structure and patterned in the usual photolithographic fashion. The openings 16 are above the channel areas 10 and the boron B+ ions are implanted in subchannel area 18 beneath the channel area 10.

The implanted boron plus lateral diffusion from both the N+ area and the channel boron area results in lower N+ concentration near the source/drain edge 99 as shown in FIG. 2, which in turn, results in higher N+ resistance. Also, the formation of N+/P+ junctions (P+ represents boron doping in channel area) results in high source/drain junction capacitance ($C_j$.) All the factors of high sheet resistance (high Rs of N+) and high junction capacitance,( high $C_j$ of N+/P+) are the challenges for high speed design of buried bit line ROM products. Note that $R_s$ (sheet resistance) as employed herein refers the value of diffused resistance per unit square of a buried bit line. The unit of $R_s$ is ohms per square. As employed herein, junction capacitance ($C_j$) refers to source/drain to substrate junction capacitance.)

Figure 3:
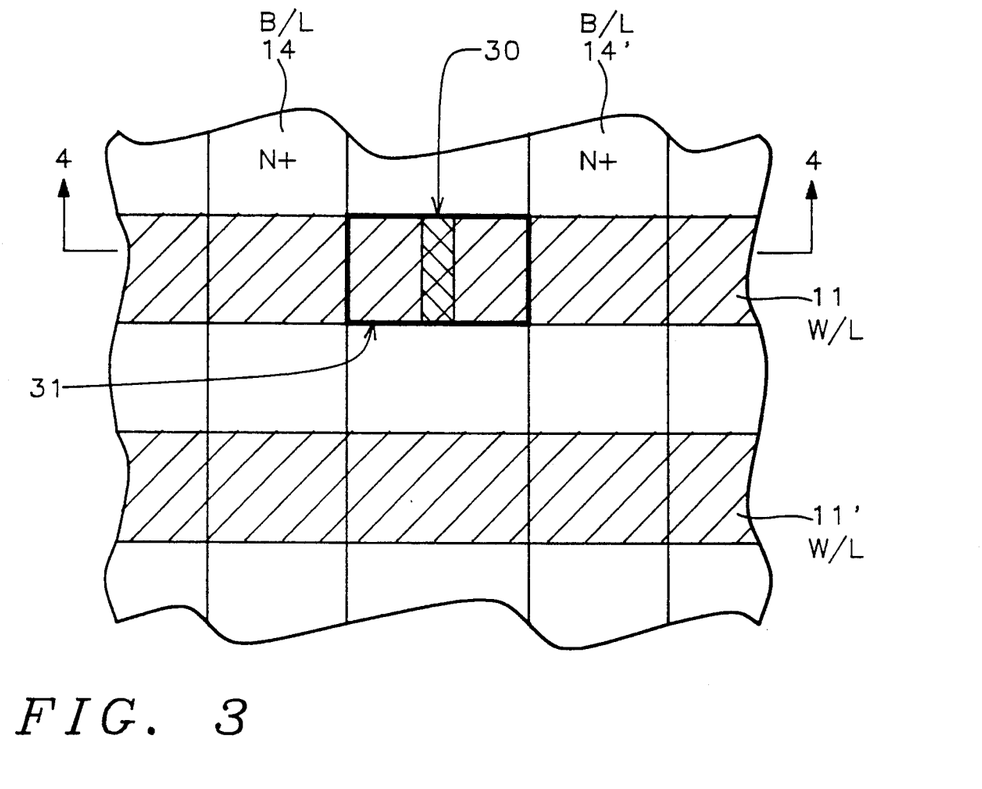
FIG. 3 shows a plan view of a region of a P+ layer within a ROM opening framed by the bitlines and within an upper word line.

FIG. 3 is a plan view showing a region of the P+ layer 30 within a ROM opening 31 framed by the bit-lines 14 and 14' and within the upper word line 11.

Figure 4:
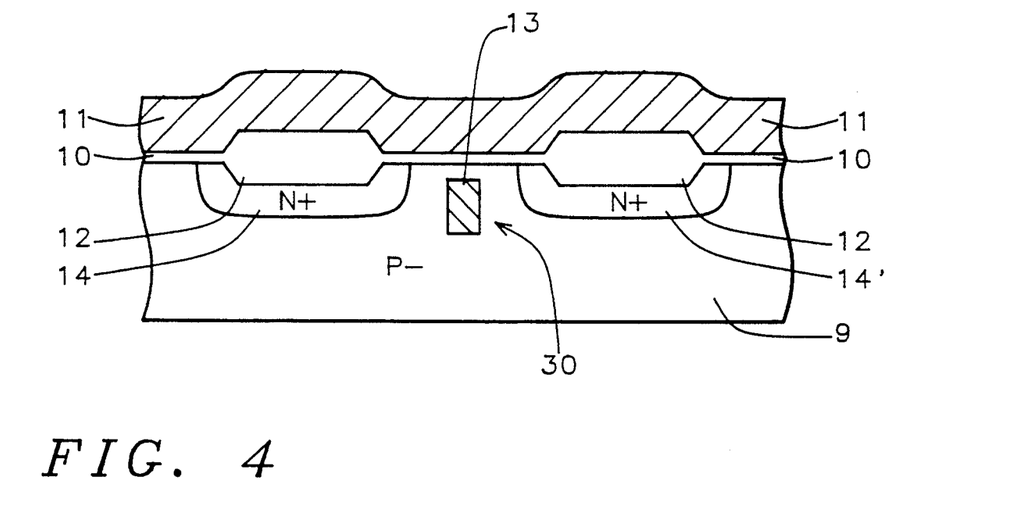
FIG. 4 shows a section taken along line 4—4 in FIG. 3.

FIG. 4 shows a section taken along line 4—4 in FIG. 3 with the P+ layer illustrated beneath the channel area 13.

An object of this invention is to make the ROM code implantation (boron for this case) into the center part of the channel area, which can achieve the goals of enhancing programming (turning the transistor off) and preventing the P+ layer from encroaching upon or contacting with the N+ source/drain junction.

SUMMARY OF THE INVENTION

A semiconductor device and a method of manufacturing a semiconductor device includes the steps of forming a first conductivity type layer on one surface of a work piece comprising a semiconductor substrate. A gate oxide is formed on the surface of the substrate. A first conductive structure is formed on the gate oxide, preferably consisting essentially of polysilicon. An insulating structure is formed in contact with the first conductive structure. Material is removed from the surface of the first conductive structure to expose at least a portion of the surface of the first layer, and to form on the remaining structure on the workpiece a second conductive structure consisting essentially of polysilicon. The second conductive structure is in electrical contact with the first conductive structure. Thus a compound conductive structure is provided on the work piece.

Preferably, the first conductive structure consists essentially of polysilicon, and the second conductive structure consists essentially of polysilicon.

Preferably, the first conductive structure is patterned into segments, the insulating structure is formed between the segments, and the second structure is deposited over the top of the first conductive structure and the insulating structure.

Preferably, a sidewall structure is formed adjacent to the insulating structure prior to deposition of the second conductive structure, and preferably, the sidewall comprises a nitride spacer.

It is preferred that the process of this invention includes the additional steps as follows:

a) patterning the conductive structure into segments,
b) forming a sacrificial structure on the first conductive structure,
c) forming the insulating structure over the work piece,
d) removing the sacrificial structure,
e) exposure of at least a portion of the surface of the first conductive structure between the segments, and
f) deposition of the second structure over the top of the first conductive and the insulating structures.

Preferably the sacrificial structure is composed of a sandwich of oxide and polysilicon and the insulating structure comprises a CVD oxide layer deposited over the work piece.

Preferably the first conductive structure is patterned into segments, the insulating structure is formed on the surface of the first conductive structure, and the second structure is deposited over the top of the first conductive structure and the insulating structure into contact with at least the edges of the first conductive structure.

Preferably, a sidewall structure is formed adjacent to the insulating structure prior to deposition of the second conductive structure.

Preferably, a nitride deposition is patterned on the first structure and then a sidewall structure is formed adjacent to the insulating structure prior to deposition of the second conductive structure.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENTS

First Embodiment

Figure 5:
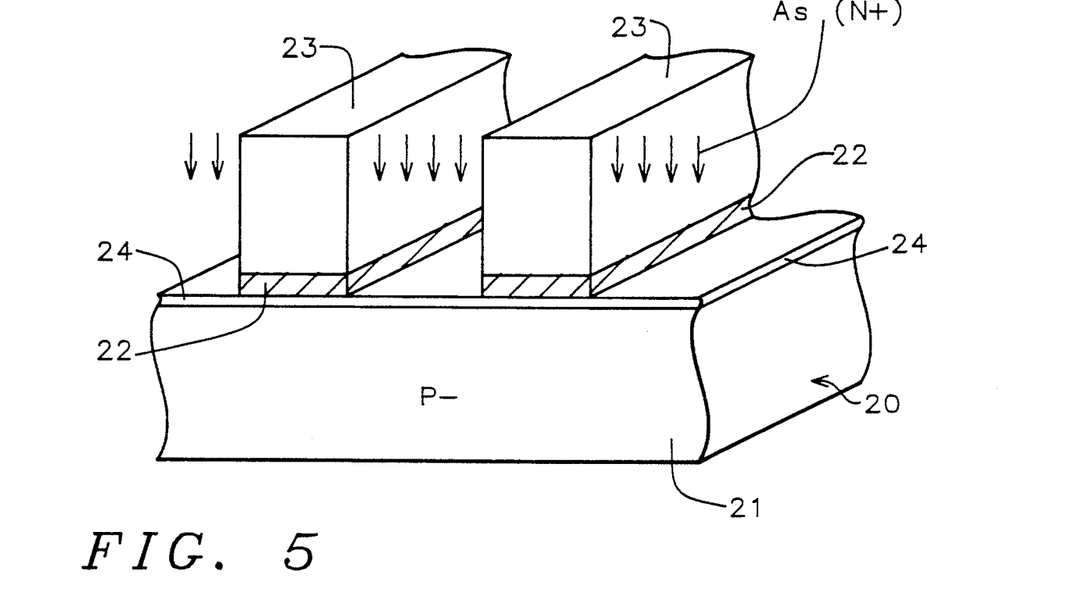
FIG. 5 shows a perspective, fragmentary, partially sectional view of a semiconductor substrate in accordance with this invention.

Referring to FIG. 5 which is a perspective, fragmentary, partially sectional view, a semiconductor substrate 20 has a p sub (p well) formed by the conventional process of diffusion and drive-in at a dose level of about $5 \times 10^{12}/cm^2$. A gate oxide layer 24 having a thickness of about 200 Å, which was formed by the process dry oxidation at 900° C. or a well-known conventional method, has in turn been coated with a poly 1 layer 22 formed to a thickness of about 500 Å using a conventional method such as LPCVD. The device with poly 1 layer 22 is then coated with photoresist 23 which has been patterned as shown in FIG. 5 with parallel stripes of photoresist 23. The photoresist 23 is patterned in accordance with the well known state of the photolithography art.

The mask formed in the resist 23 is employed for removing poly 1 layer 22 in the areas which were exposed by the development of the mask 23. The unwanted portions of poly 1 layer 22 are etched away by an anisotropic dry etching method. Mask 23 serves as the poly 1 etch mask and also serves as a mask for the buried N+ implant in buried bit line regions 27.

A "VT adjustment implant" is made as shown in FIG. 5. A VT adjustment implant refers to a regular ion-implant step made to adjust the VT (threshold voltage) value of a transistor which can be done either before or after gate oxidation. A wet chemical etch can be employed as an alternative.

Figure 6:
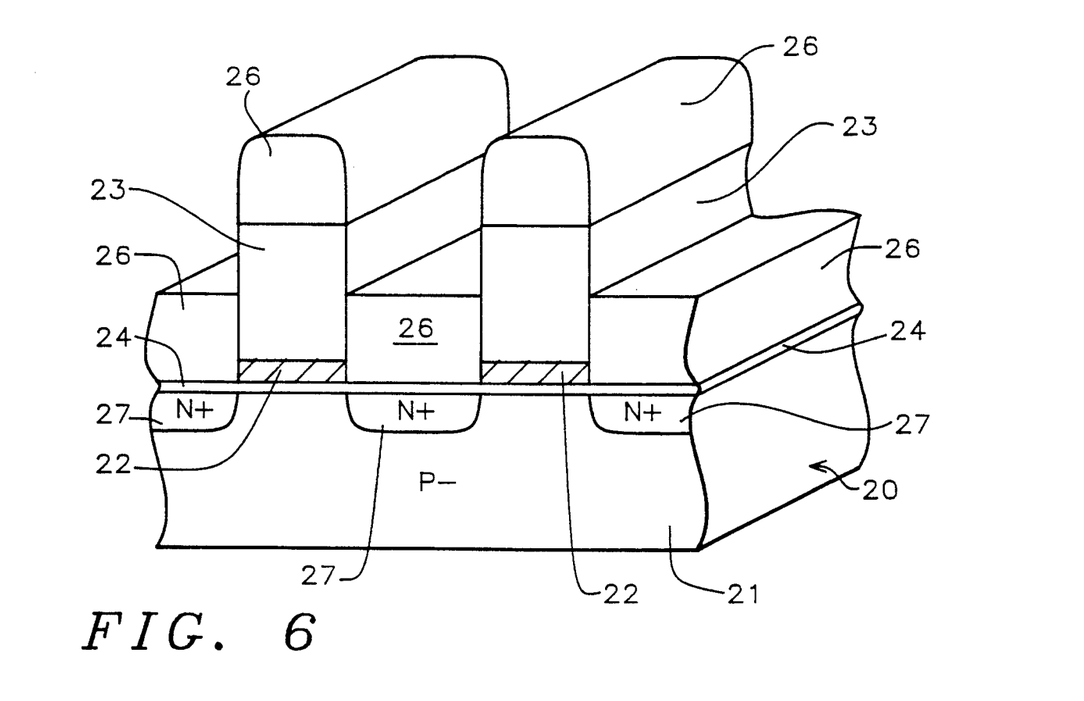
FIG. 6 shows the device of FIG. 5 after additional processing steps have been performed.

Next, FIG. 6 shows the device of FIG. 5 after additional processing steps have been performed. An ion implant of buried arsenic (As) N+ ions is deposited into the regions 27 (using the same mask as poly 1 layer 22) shown in FIG. 6. The chemical species of the arsenic dopant is implanted with a dose of between about $1 \times 10^{15}/cm^2$ to about $3 \times 10^{15}/cm^2$, preferably less than or equal to $3 \times 10^{18}/cm^2$. It is implanted at an energy of between about 50 keV and about 100 keV in a high current implanter type of tool.

Subsequently, referring to FIG. 6, a thick layer of about 5000 Å of oxide 26 ($SiO_2$) is deposited by a low temperature CVD process (at a temperature of about 300° C.) for the purpose of lift off. The $SiO_2$ is deposited by a low temperature CVD process at a temperature of between about 250° C. and about 350° C. to a thickness of about 5000 Å by CVD (chemical vapor deposition) from gases selected from the group consisting of silane ($SiH_4$) and oxygen ($O_2$.)

Figure 7:
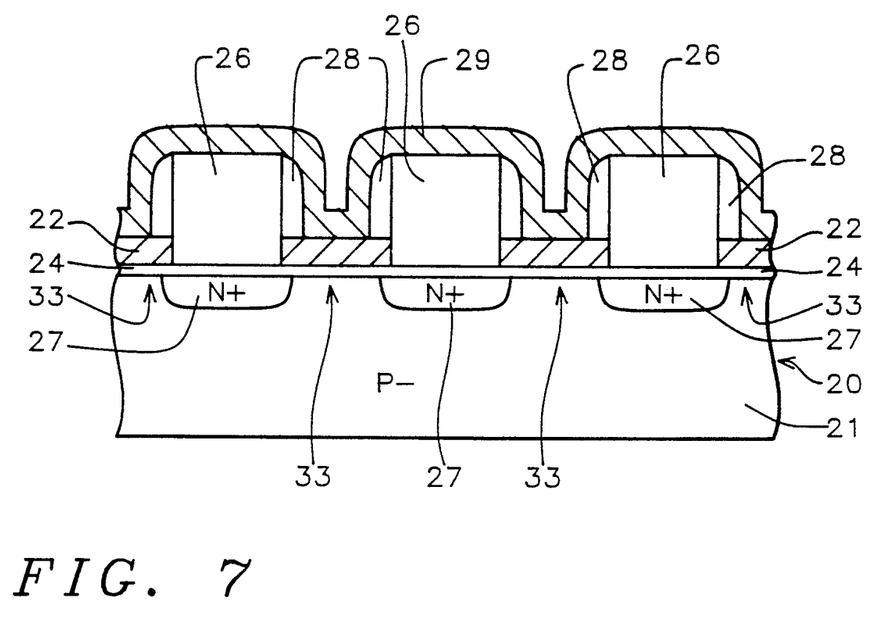
FIG. 7 shows the device of FIG. 6 after resist has been removed in the conventional way lifting off excess oxide and leaving the oxide which was deposited into openings.

In FIG. 7 the resist 23 in FIG. 6 has been removed in the conventional way lifting off the excess oxide 26 and leaving the oxide 26 which was deposited in the openings down onto the poly 1 layer 22. Then an optional silicon nitride $Si_3N_4$ spacer 28 has been deposited adjacent to the oxide 26 using the process of nitride deposition following an etch back employing a conventional anisotropic dry etching process.

This process with the nitride spacer 28 narrows the code implant opening further. However, the poly 2 deposit narrows the code implant to a degree approximating a sufficient amount. Accordingly, in that case, the nitride spacer 28 is optional. Above the spacer 28 and oxide 26, another polysilicon, poly 2, layer 29 is deposited upon the top of the oxide 26, the spacers 28 and the exposed poly 1 layer 22. Note that the poly 1 and poly 2 layers are connected mechanically and electrically or "shorted together", i.e. in electrical contact, in the channel area 33 between the bit lines 27. The poly 2 layer is deposited by the conventional method with a poly 2 thickness of between about 2000 Å and about 4000 Å.

Figure 8:
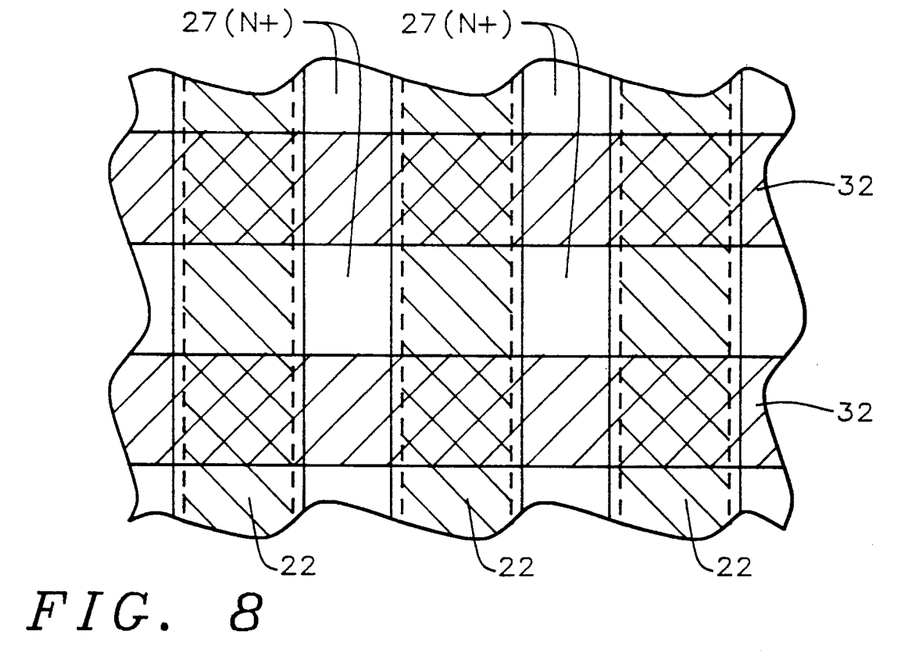
FIG. 8 is a top plan view of FIG. 7.

Referring to FIG. 8, the pattern of poly 1 layer 22 is parallel long lines. Poly 2/poly 1 etch (layers 32 and 22) is a stacked layer etch.

Note that the thickness of the poly 2 layer 29 determines the width of the code implant because the layer deposits on the side walls as it deposits onto the poly 1 layer.

The thicker dimension of the oxide 26 reduces the capacitance between the word lines 32 and the bit lines 27, since they are spaced farther apart. The poly 2 layer is doped with phosphorous.

After the doping of poly 2 layer 29, an optional silicide deposition (not shown) can be made. The use of silicide or poly 2 is optional. Silicide on poly 2 is a well known polycide gate process, which is helpful to reduce the word line resistance.

Figure 9:
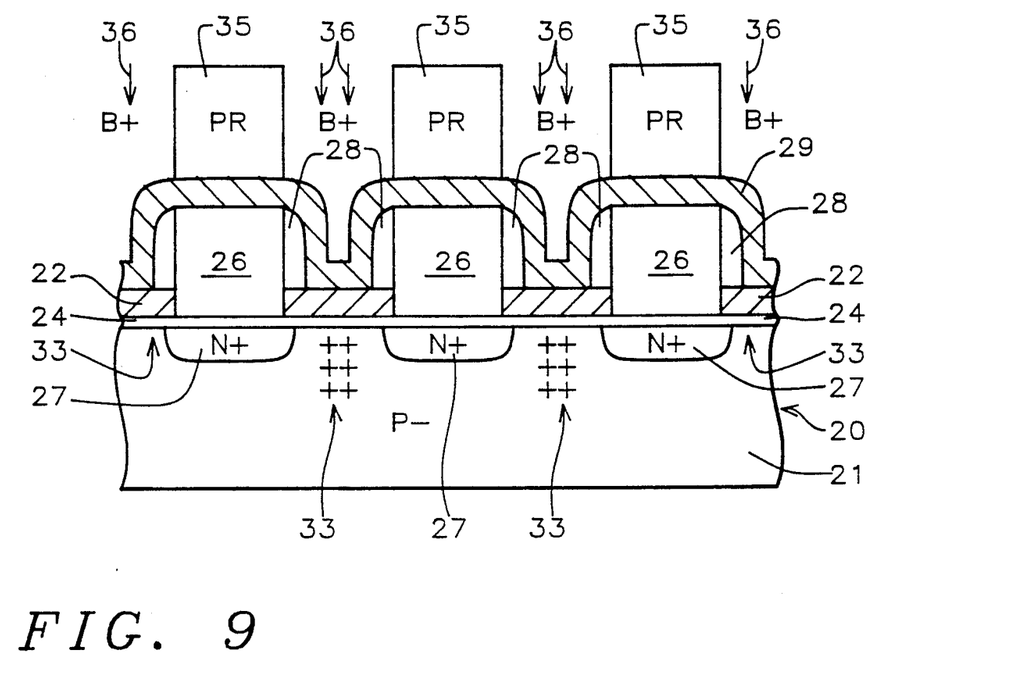
FIG. 9 shows the product of FIGS. 7 and 8 after photoresist has been applied and patterned.

Referring to FIG. 9, the poly 2 layer 29 is next covered with photoresist layer 35 and exposed to word line photolithography and a mask is developed. Next the poly 2 layer 29 and poly 1 layer 22 are etched using the mask formed by the resist layer 35.

There is an N+/P+ source/drain of peripheral transistors formed (not shown.) The strips of poly 2 word lines 32 are shown in FIG. 8 which is a top plan view of FIG. 7. The buried bit lines 27 are also shown to facilitate explanation. FIG. 9 shows the product of FIG. 7 after photoresist 35 has been applied above the poly 2 layer 29, etc.

The photoresist 35 is formed into a mask with an opening 37 above the channel 33. An ion implant 36 of boron B+ ions is implanted into the opening 37. The chemical species of the dopant implanted is boron with a dose of between about $7 \times 10^{13}/cm^2$ to about $2 \times 10^{14}/cm^2$, at an energy of about 100 keV. At the end of the ion implantation, the resist is removed.

By combining the nitride spacer 28 and the poly 2 structure 29, a self aligned smaller ROM code opening is provided for implanting of boron.

Second Preferred Embodiment

Figure 10A:
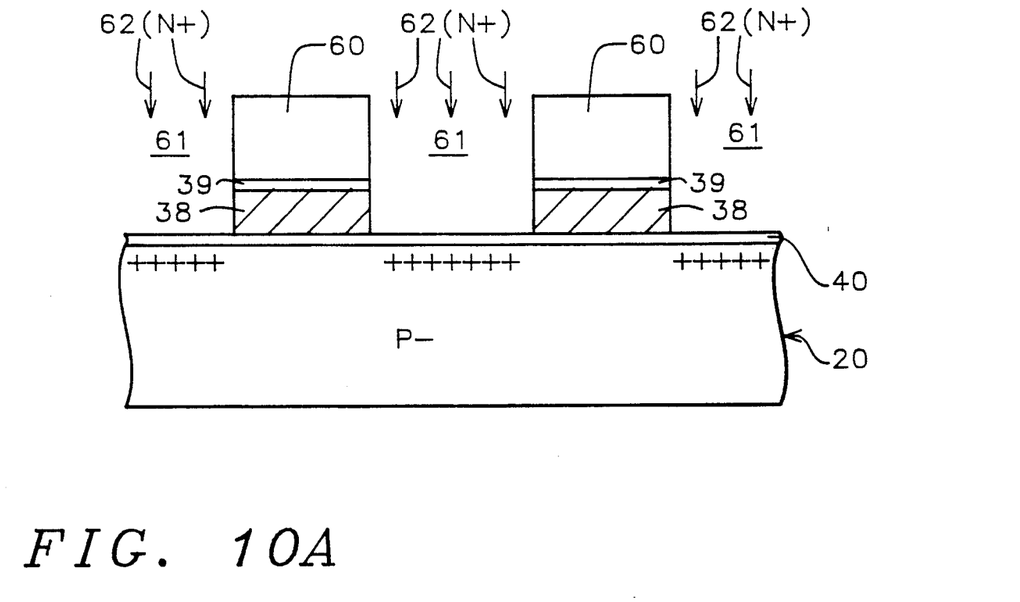
FIGS. 10A-10E show a second embodiment of the process of this invention.

Referring to FIG. 10A, a semiconductor substrate 20 is coated with a gate oxide layer 40, which is coated in turn with a poly 1 layer 38 with a thickness of about 500 Å. Next, an oxide layer 39 is applied to a thickness of about 200 Å above poly 1 layer 38. Oxide layer 39 in turn is coated with a layer 60 of poly 2 deposited to a thickness of about 3,000 Å. A mask is applied and openings 62 are opened in the layers 38, 39 and 60 down to the gate oxide 40. Then the substrate 20 is ion implanted with N+ ions according to the process described above in connection with FIG. 5 producing the buried bit lines, source/drain of memory cells as shown by regions 57. The process of employing poly 2 raises the height of the structure giving a resulting thicker oxide layer than the poly 1 gate electrode 38.

Figure 10B:
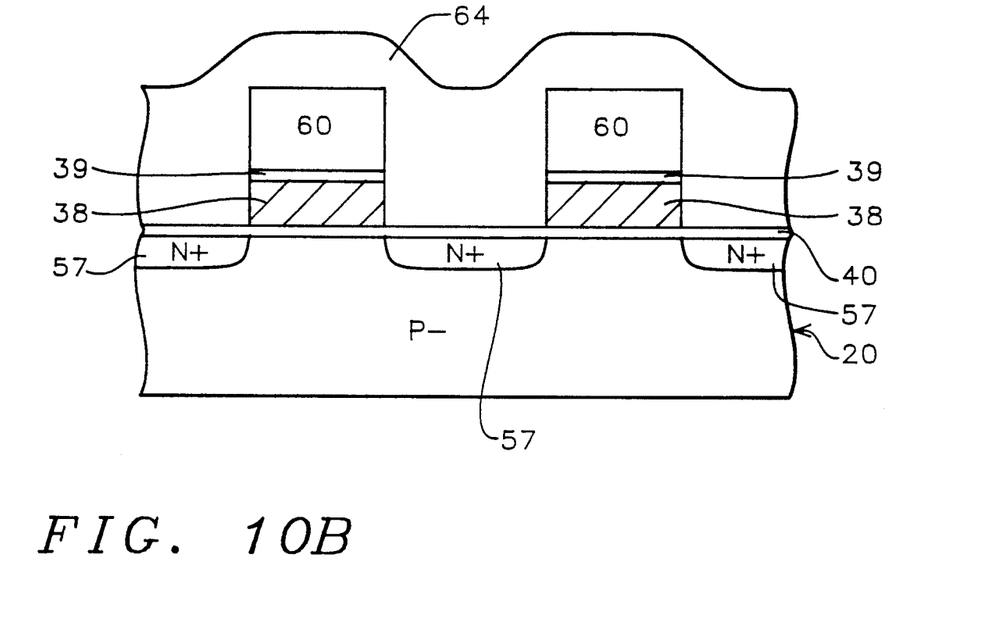

Referring to FIG. 10B a layer 64 of CVD oxide, photoresist or SOG (Spin On Glass) is deposited over the structure of FIG. 10A.

Figure 10C:
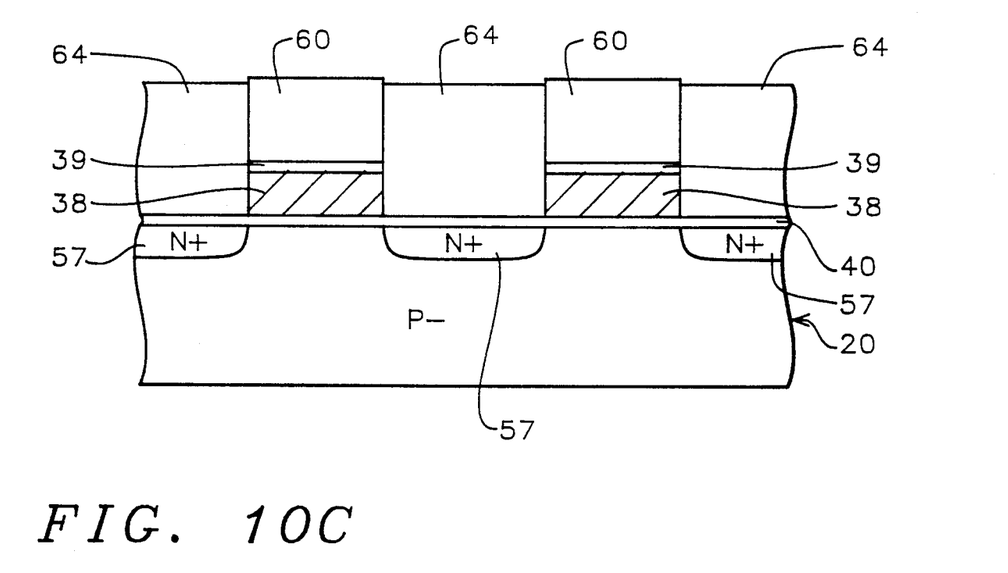

Referring to FIG. 10C the device is shown with a planarized surface provided by a planarization etch back process where layer 64 has been planarized by a dry etch back exposing the upper surface of the poly 2 layer 60.

Figure 10D:
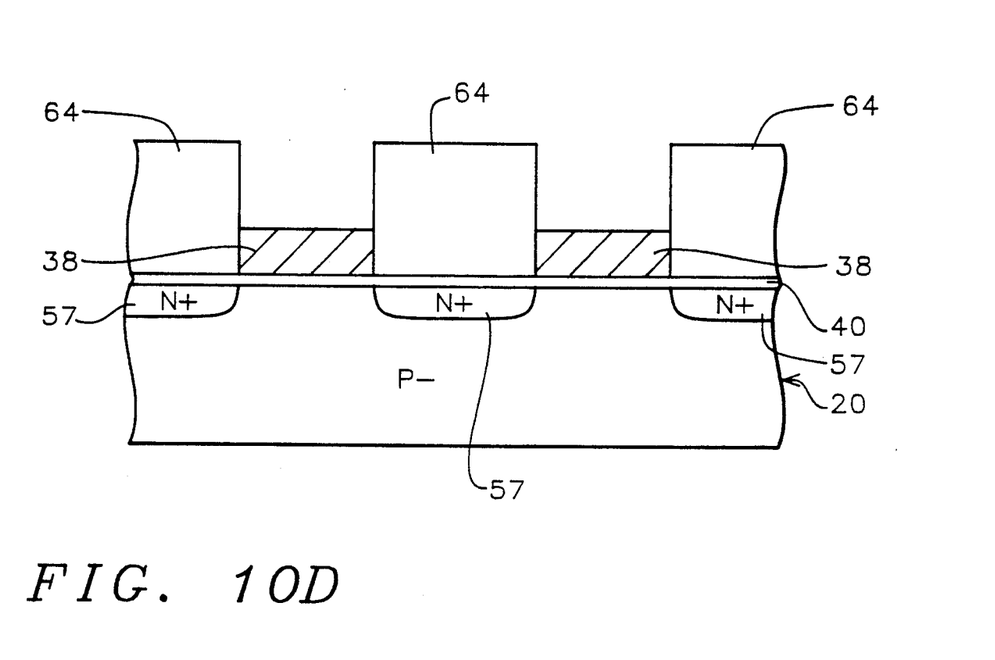

Referring to FIG. 10D, the poly 2 layer 60 and the layers of oxide 39 have been removed. The result is that the upper surface of poly 1 layer 38 is exposed through openings 68.

Figure 10E:
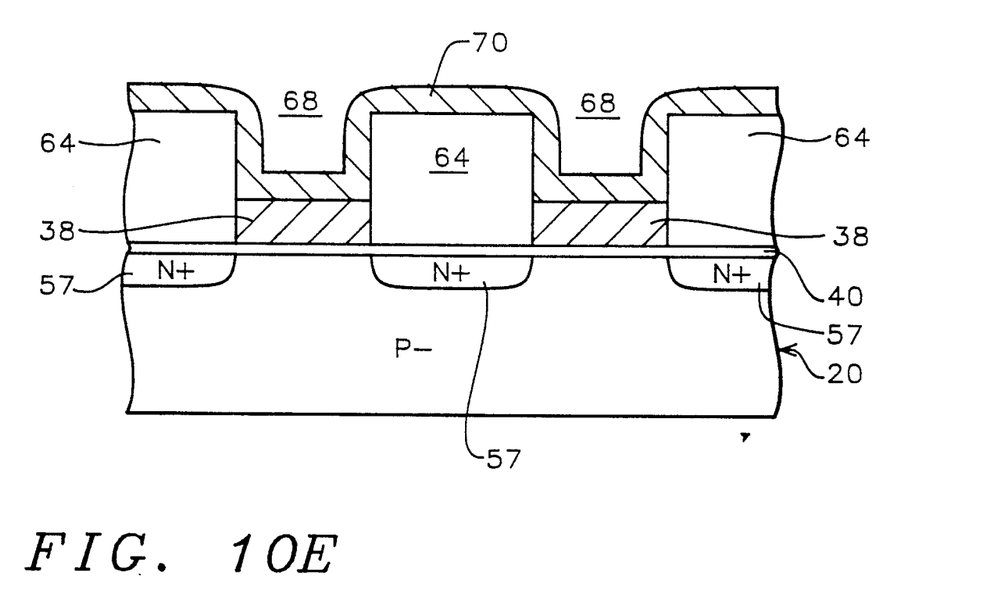

Referring to FIG. 10E a layer 70 of poly 3 is deposited upon the product of FIG. 10D in contact with poly 1 layer 38 partially filling the openings 68. Layer 38 of poly 1 and layer 70 of poly 3 are electrically connected. The result is that, the word lines are formed in layer 70 (after it has been etched by a lithography process as described above.)

Third Preferred Embodiment

Figure 11A:
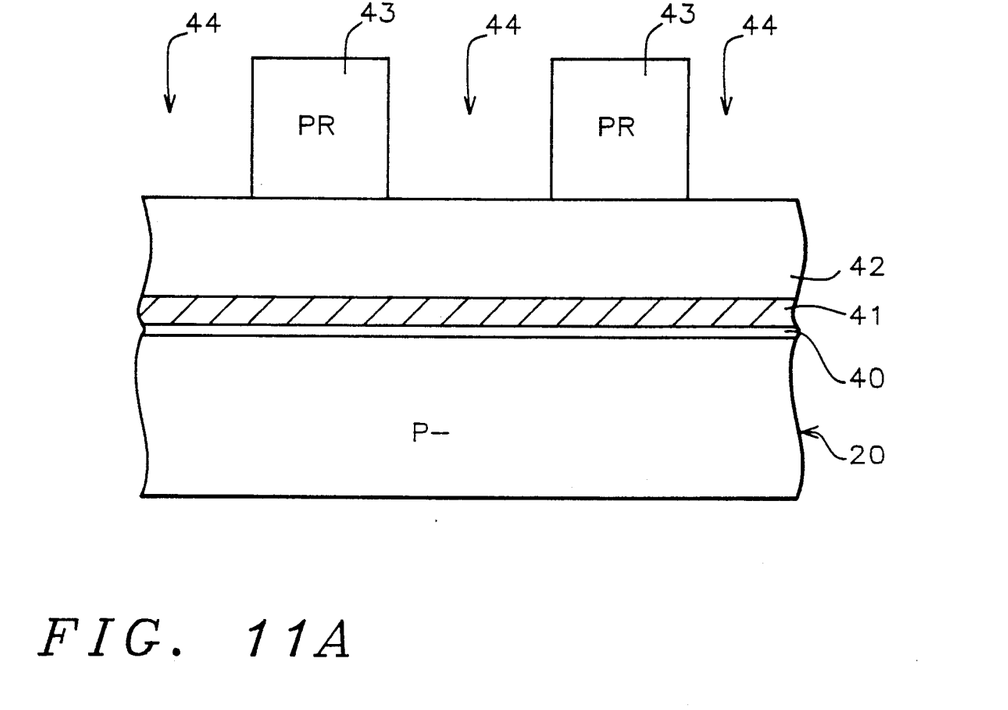
FIGS. 11A-11D show a third embodiment of the process of this invention.

Referring to FIG. 11A, a semiconductor substrate 20 is coated with a gate oxide layer 40. Layer 40 is coated in turn with a poly 1 layer 41 with a thickness of about 500 Å, which in turn is coated with a layer 42 of silicon nitride ($Si_3N_4$) deposited to a thickness of about 3000 Å.

Figure 11B:
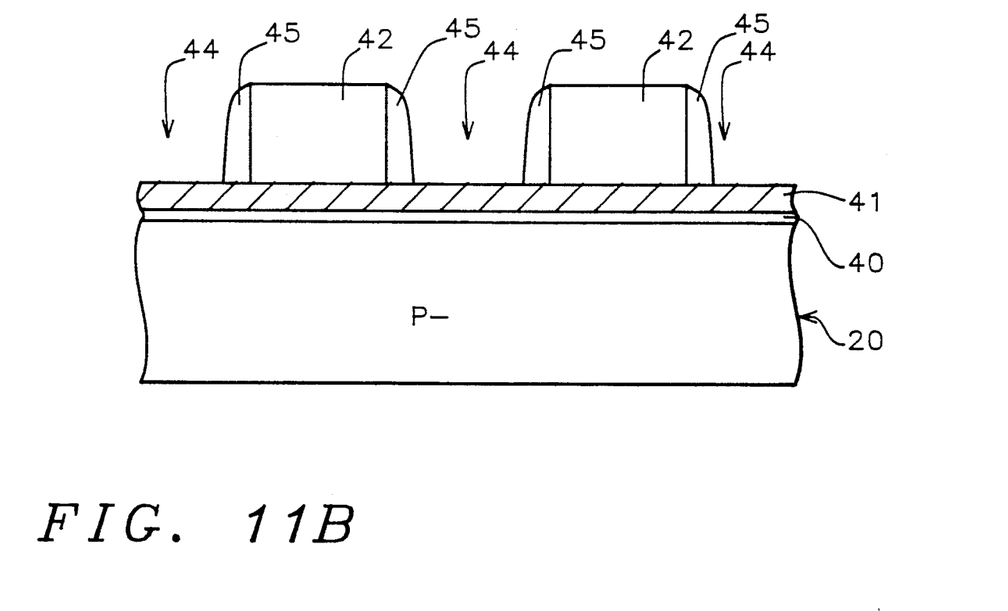
Figure 11C:
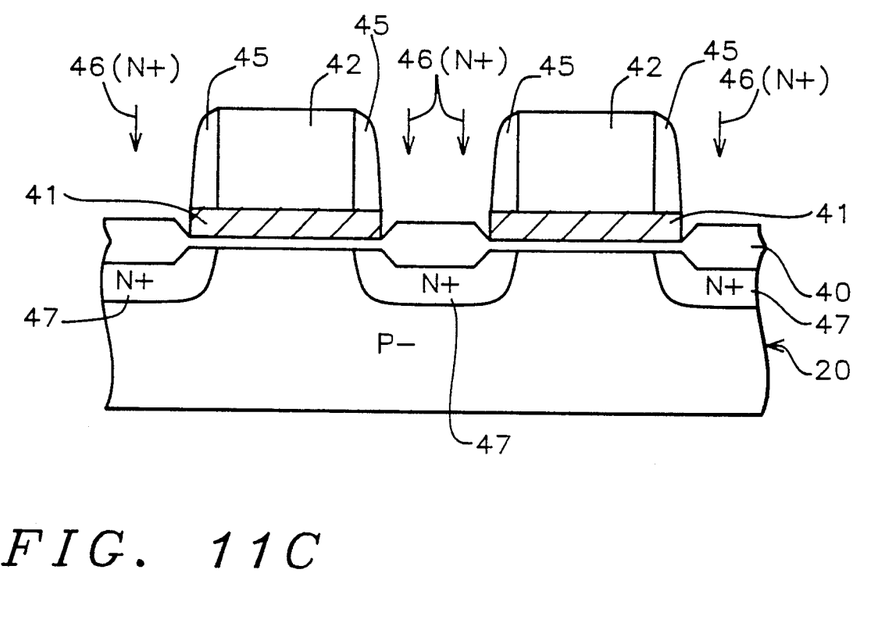

Above the nitride layer 42, a photoresist mask 43 has been formed by depositing photoresist, exposing and developing the mask 43 in the photoresist with openings 44 for the N+ bit line to be formed in FIG. 11C.

Referring to FIG. 11B, the nitride layer 42 has been etched using the process of nitride etching employed above leaving the openings 44.

Next, in a blanket deposition, oxide layer 45 is deposited by chemical vapor deposition to a thickness of about 3000 Å, using the process described with respect to oxide 26 in FIG. 6 above.

Then the oxide layer 45 is etched using a conventional dry etch process to form oxide spacers 45 adjacent to the nitride structure 42 remaining leaving the openings 44 narrower by the width of the spacers 45.

Referring to FIG. 11C, the poly 1 is etched using the process employed above for etching poly 1 in FIG. 5. A conventional poly etch process can be employed.

Next, an N+ implant is performed in bit lines 47. The process implants ions of arsenic (As), as N+ ions, deposited into the implant regions (bit lines 47 shown in FIG. 11C.) The chemical species of the N+ dopant is implanted with a dose of between about $1 \times 10^{15}/cm^2$, and preferably less than or equal to about $5 \times 10^{15}/cm^2$. It is implanted at an energy of between about 50 keV and about 100 keV in a conventional high current type of tool.

After the N+ bit line implantation, it is optional that an oxidation of the surface of the gate oxide is performed by a conventional thermal oxidation, e.g. steam oxidation at a temperature of about 900° C. for about 10 minutes.

Figure 11D:
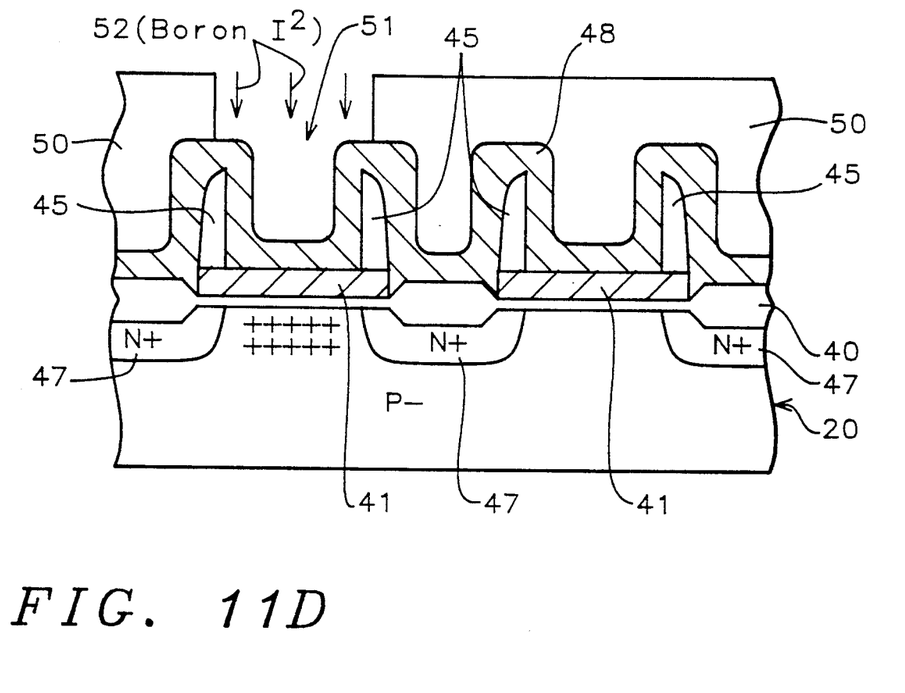

In FIG. 11D, the following steps occur.
1) There is a poly 2 dep/doping (silicide formation (optional.)
2) An optional poly 2 (word line) masking and etching is performed, as before.
3) A ROM code masking is applied as before.
4) A boron implant is performed as before.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing a semiconductor device, which comprises the steps of
   (a) forming a first conductivity type layer on one surface of a work piece comprising a semiconductor substrate,
   (b) forming a gate oxide layer on the surface of said substrate,
   (c) forming a first conductive structure having edges on said gate oxide layer,
   (d) forming an insulating structure in contact with said first conductive structure,
   (e) removing material from the surface of said first conductive structure to expose at least a portion of the surface beneath said first conductive structure, and
   (f) forming on the remaining structure on said workpiece a second conductive structure in electrical contact with said first conductive structure, whereby a compound conductive structure is provided on said work piece.

2. The method of claim 1 wherein said first conductive structure consists essentially of polysilicon, and a second conductive structure consisting essentially of polysilicon.

3. The method of claim 1 wherein said first conductive structure is patterned into segments, said insulating structure is formed between said segments, and said second structure is deposited over the top of said first conductive structure and said insulating structure.

4. The method of claim 2 wherein said first conductive structure is patterned into segments, said insulating structure is formed between said segments, and said second structure is deposited over the top of said first conductive structure and said insulating structure.

5. The method of claim 4 wherein a sidewall structure is formed adjacent to said insulating structure prior to deposition of said second conductive structure.

6. The method of claim 4 wherein said sidewall comprises a nitride spacer.

7. The method of claim 1 wherein including the steps as follows:
   a) patterning said conductive structure into segments,
   b) forming a sacrificial structure on said first conductive structure,
   c) forming said insulating structure over the work piece,
   d) removing said sacrificial structure,
   e) exposure of at least a portion of the surface of said first conductive structure between said segments, and
   f) deposition of said second structure over the top of said first conductive structure and said insulating structure.

8. The method of claim 7 wherein said sacrificial structure is composed of a sandwich of oxide and polysilicon.

9. The method of claim 7 wherein said sacrificial structure is composed of a sandwich of oxide and polysilicon and said insulating structure comprises a CVD oxide layer deposited over said work piece.

10. The method of claim 1 wherein said first conductive structure is patterned into segments, said insulating structure is formed on the surface of said first conductive structure, and said second structure being deposited over the top of said first conductive structure and said insulating structure into contact with at least the edges of said first conductive structure.

11. The method of claim 10 wherein a sidewall structure is formed adjacent to said insulating structure prior to deposition of said second conductive structure.

12. The method of claim 9 wherein a nitride deposition is patterned on said first structure and then a sidewall structure is formed adjacent to said insulating structure prior to deposition of said second conductive structure.

* * * * *